US012719485B2

(12) United States Patent
Lutwak et al.

(10) Patent No.: US 12,719,485 B2
(45) Date of Patent: Aug. 25, 2026

(54) TECHNIQUES FOR CONTROLLING VAPOR PRESSURE OF SUBJECT MATERIALS IN VAPOR CELLS AND RELATED METHODS

(71) Applicant: Microchip Technology Incorporated, Chandler, AZ (US)

(72) Inventors: Robert Lutwak, Marblehead, MA (US); Lichung Ha, Wakefield, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 124 days.

(21) Appl. No.: 18/529,146

(22) Filed: Dec. 5, 2023

(65) Prior Publication Data

US 2024/0413828 A1 Dec. 12, 2024

Related U.S. Application Data

(60) Provisional application No. 63/507,212, filed on Jun. 9, 2023.

(51) Int. Cl.
*H03L 7/26* (2006.01)
*G04F 5/14* (2006.01)

(52) U.S. Cl.
CPC .................. *H03L 7/26* (2013.01); *G04F 5/14* (2013.01); *G04F 5/145* (2013.01)

(58) Field of Classification Search
CPC ... G04F 5/14; G04F 5/145; H03L 7/26; H01S 1/06; H03B 17/00
See application file for complete search history.

(56) References Cited

U.S. PATENT DOCUMENTS

2015/0270843 A1* 9/2015 Nakajima .................. H03L 7/26 331/94.1
2016/0105149 A1* 4/2016 Ishihara .................. G04F 5/145 53/467
2023/0020554 A1 1/2023 Lutwak
2023/0143437 A1 5/2023 Lutwak et al.
2023/0266716 A1* 8/2023 Miyakawa .............. G04F 5/145 324/305

FOREIGN PATENT DOCUMENTS

WO 2023/086119 A1 5/2023

OTHER PUBLICATIONS

International Search Report of International Application No. PCT/US2023/082577, mailed Aug. 8, 2024, 3 pages.
Written Opinion of the International Searching Authority of International Application No. PCT/US2023/082577, mailed Aug. 8, 2024, 5 pages.

* cited by examiner

*Primary Examiner* — Ryan Johnson
(74) *Attorney, Agent, or Firm* — TraskBritt

(57) ABSTRACT

A method of manufacturing a vapor cell includes forming a body of the vapor cell having walls defining a cavity thereinbetween, the cavity having an amount of a subject material contained therein. The method also includes forming a pore structure having a substrate material with pores of a substantially uniform dimension formed therein, the pore structure disposed along a portion of one or more of the walls of the vapor cell. The method further includes forming a liner material of a uniform thickness over one or more internal surfaces of the pores, wherein the subject material exhibits a reduced wetting angle on the liner material which is less than a wetting angle of the subject material on the substrate material.

25 Claims, 11 Drawing Sheets

Figure 4:
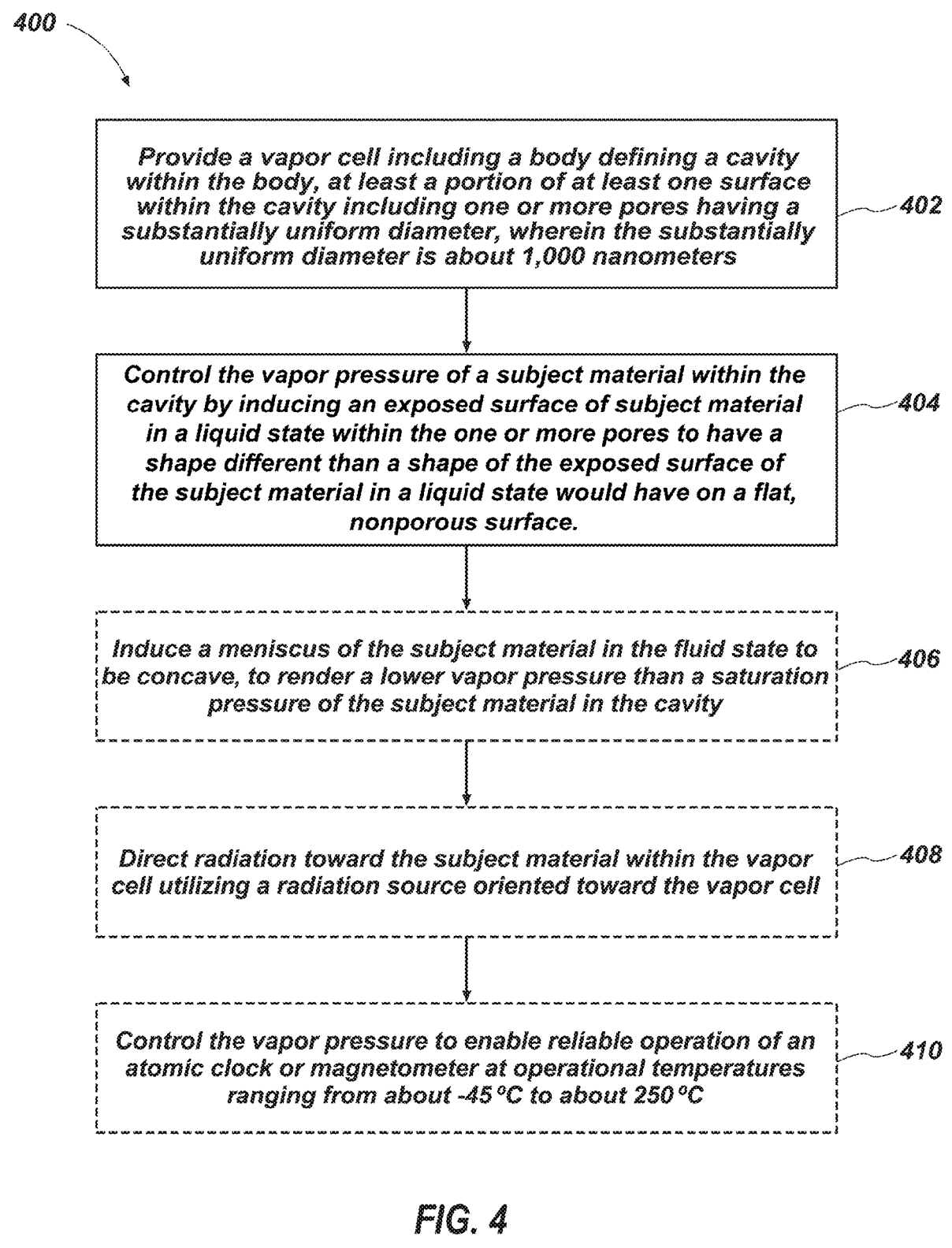

400

Provide a vapor cell including a body defining a cavity within the body, at least a portion of at least one surface within the cavity including one or more pores having a substantially uniform diameter, wherein the substantially uniform diameter is about 1,000 nanometers — 402

Control the vapor pressure of a subject material within the cavity by inducing an exposed surface of subject material in a liquid state within the one or more pores to have a shape different than a shape of the exposed surface of the subject material in a liquid state would have on a flat, nonporous surface. — 404

Induce a meniscus of the subject material in the fluid state to be concave, to render a lower vapor pressure than a saturation pressure of the subject material in the cavity — 406

Direct radiation toward the subject material within the vapor cell utilizing a radiation source oriented toward the vapor cell — 408

Control the vapor pressure to enable reliable operation of an atomic clock or magnetometer at operational temperatures ranging from about -45 °C to about 250 °C — 410

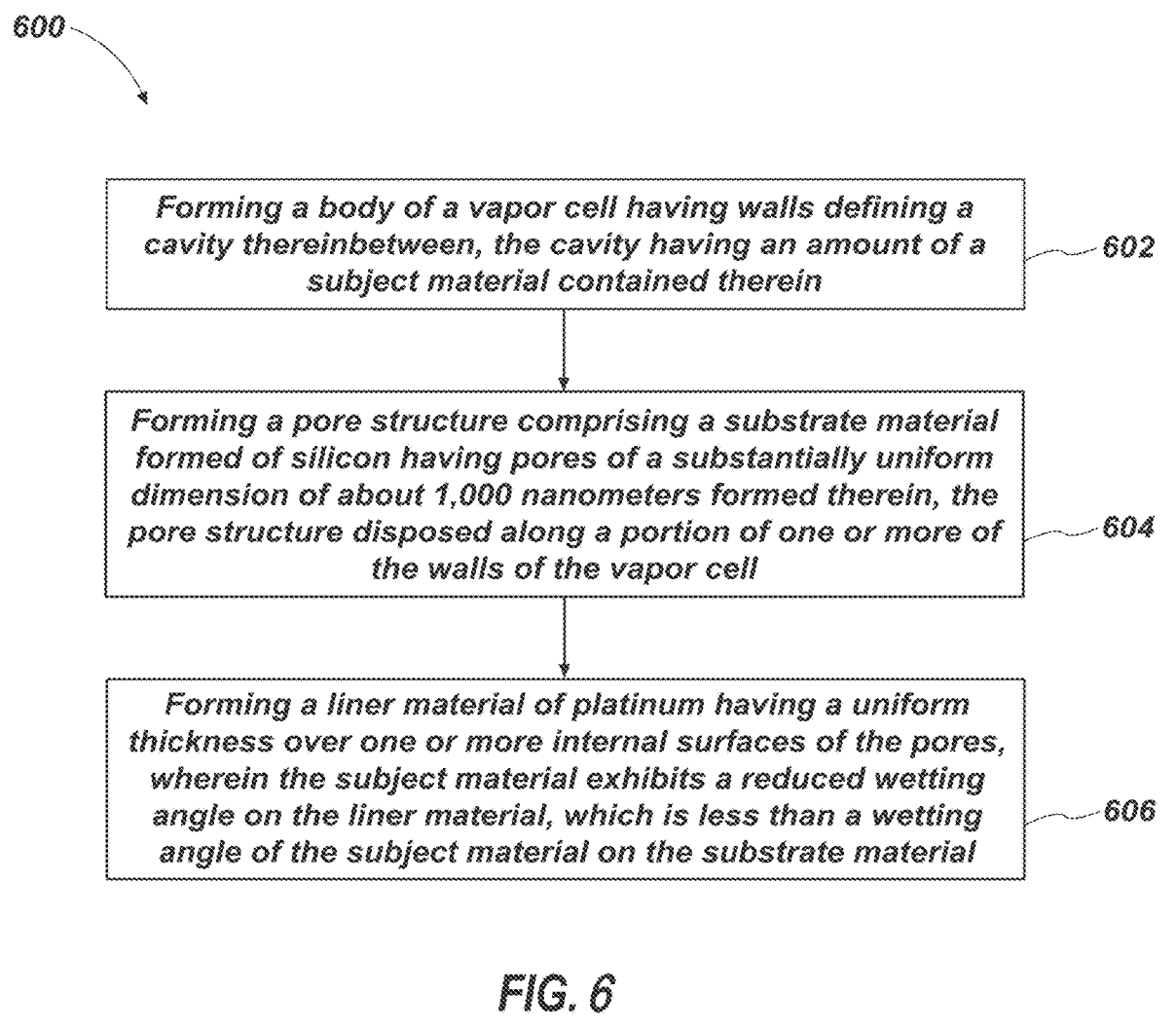

Forming a body of a vapor cell having walls defining a cavity thereinbetween, the cavity having an amount of a subject material contained therein — 602

Forming a pore structure comprising a substrate material formed of silicon having pores of a substantially uniform dimension of about 1,000 nanometers formed therein, the pore structure disposed along a portion of one or more of the walls of the vapor cell — 604

Forming a liner material of platinum having a uniform thickness over one or more internal surfaces of the pores, wherein the subject material exhibits a reduced wetting angle on the liner material, which is less than a wetting angle of the subject material on the substrate material — 606

FIG. 6

TECHNIQUES FOR CONTROLLING VAPOR PRESSURE OF SUBJECT MATERIALS IN VAPOR CELLS AND RELATED METHODS

CROSS-REFERENCE TO RELATED APPLICATION

This application claims the benefit under 35 U.S.C. § 119(e) of the priority date of U.S. Provisional Patent Application Ser. No. 63/507,212, filed Jun. 9, 2023, for TECHNIQUES FOR CONTROLLING VAPOR PRESSURE OF SUBJECT MATERIALS IN VAPOR CELLS AND RELATED METHODS, the disclosure of which is incorporated herein in its entirety by this reference.

STATEMENT REGARDING FEDERALLY SPONSORED RESEARCH OR DEVELOPMENT

This invention was made with government support under W911NF2120016 awarded by U.S. Army Research Laboratory. The government has certain rights in the invention.

FIELD

This disclosure relates generally to techniques for controlling vapor pressure of subject materials in vapor cells, such as for atomic clocks, atomic sensors, and other applications. More specifically, disclosed examples relate to structures and materials for controlling the vapor pressure of alkali-metals, which may improve reliability of operation of vapor cells, such as for atomic clocks, atomic sensors, and other applications, across broader temperature ranges.

BACKGROUND

Vapor pressure is affected by surface tension according to the Kelvin equation:

$$\frac{P}{P_{sat}} = e^{2\gamma V_m / rRT},$$

where $P/P_{sat}$ is the ratio of the vapor pressure to the saturation pressure, $\gamma$ is the surface tension, $V_m$ is the molar volume of the liquid, r is the radius of the droplet, R is the universal gas constant, and T is the absolute temperature. Vapor pressure is relevant in a variety of operational contexts including, without limitation, atomic clocks and atomic sensors.

BRIEF SUMMARY

In some examples, a vapor cell includes a body having walls defining a cavity thereinbetween, the cavity containing an amount of a subject material. The vapor cell also has a pore structure having a substrate material with pores of a substantially uniform diameter formed therein, the pore structure disposed along a portion of one or more of the walls, and a liner material disposed over one or more internal surfaces of the pores.

In other examples, a method of manufacturing a vapor cell includes forming a body of the vapor cell having walls defining a cavity thereinbetween, the cavity having an amount of a subject material contained therein. The method also includes forming a pore structure including a substrate material formed of silicon having pores of a substantially uniform dimension of about 1,000 nanometers formed therein, the pore structure disposed along a portion of one or more of the walls of the vapor cell. The method further includes forming a liner material of platinum having a uniform thickness over one or more internal surfaces of the pores, wherein the subject material exhibits a reduced wetting angle on the liner material which is less than a wetting angle of the subject material on the substrate material.

In some other examples, a system includes an emitter positioned and oriented to direct radiation through windows of a vapor cell, wherein the vapor cell includes a body having walls defining a cavity thereinbetween and an amount of a subject material disposed in the cavity. The vapor cell also includes a pore structure having a substrate material with pores of a substantially uniform diameter formed therein, the pore structure disposed along a portion of one or more of the walls, and a liner material of a uniform thickness disposed over internal surfaces of the pores, the subject material exhibiting a wetting angle on the liner material which is less than a wetting angle of the subject material on the substrate material. The system also includes a detector positioned and oriented to detect the radiation directed through the windows of the vapor cell.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings. In the drawings:

FIG. 4 is a flowchart depicting an example of an illustrative method of using a vapor cell;

FIG. 6 is a flowchart depicting another example of an illustrative method of making a vapor cell.

DETAILED DESCRIPTION

Figure 1A:
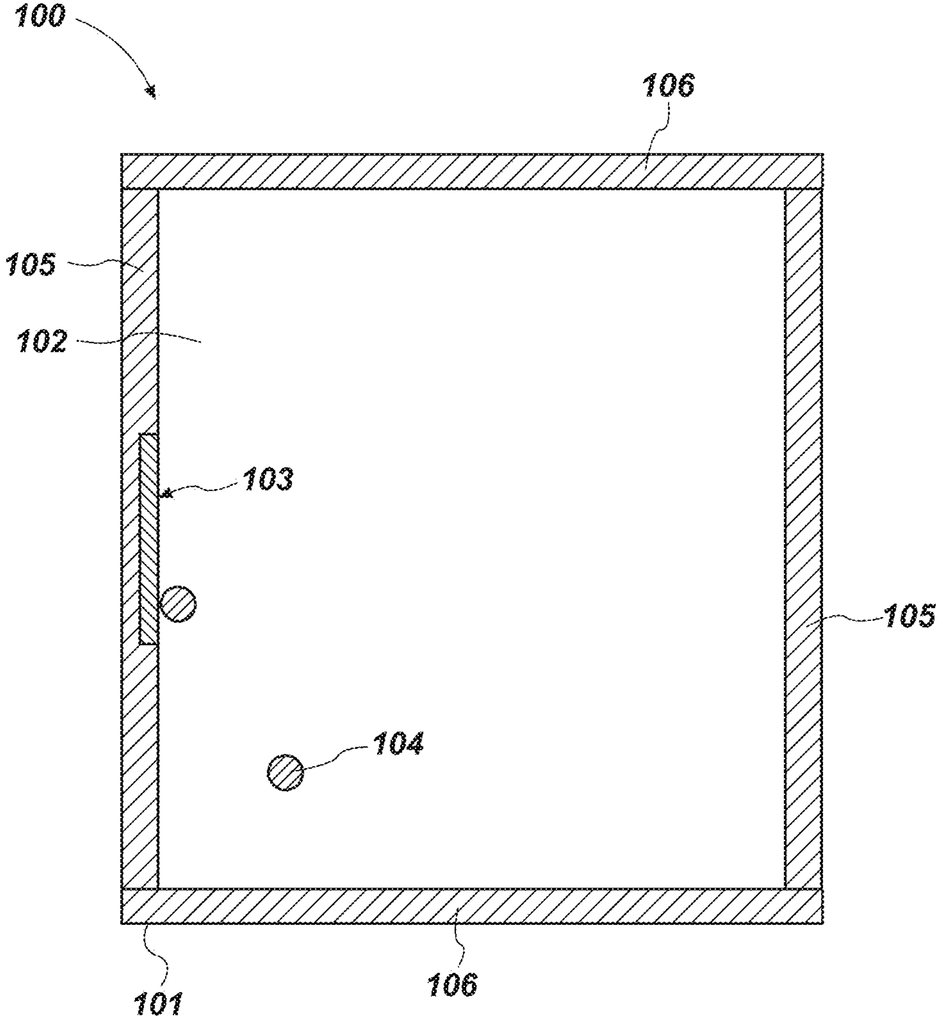
FIGS. 1A and 1B are schematic cross-sectional side views of examples of vapor cells.

Disclosed examples relate generally to designs for microporous or nanoporous constructions for vapor cells, as nonlimiting examples, atomic clocks and atomic sensors, which may, as a nonlimiting example, increase the temperature range over which reliable operation may be achieved. More specifically, disclosed examples relate to designs for porous constructions for controlling (e.g., suppressing) vapor pressure. For example, at least a portion of at least one interior wall in a vapor cell may include a porous construction having one or more pores sized, shaped, positioned, and configured to control (e.g., suppress) vapor pressure of a subject material (e.g., alkali metal, strontium, ytterbium) in the vapor cell. Such vapor pressure control may increase the temperature range over which reliable operation may be enabled. Some specific, non-limiting disclosed examples of a porous construction may involve modifying the surface roughness of at least the portion of the interior wall(s) of a vapor cell to form pores thereon. Additionally, or alternatively, at least one pore structure having one or more pores formed therein may be placed in a vapor cell to control (e.g., suppress) the vapor pressure of the subject material (e.g., alkali metal, strontium, ytterbium) contained therein. Other specific, nonlimiting disclosed examples may, additionally or alternatively, reduce performance degradation of atomic clocks and atomic sensors when operated in high ambient-temperature environments.

The illustrations presented in this disclosure are not meant to be actual views of any particular vapor cell, system including a vapor cell, structure including one or more pores, or component thereof, but are merely idealized representations employed to describe illustrative examples. Thus, the drawings are not necessarily to scale. In addition, certain actions in flowcharts are depicted in dashed lines to clearly indicate that those actions are "optional," however, such labeling is not to be interpreted to mean that the other actions in flowcharts depicted in solid lines, are required, critical, or otherwise necessary in connection with a given example.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The term "pore," as used herein, means and includes surface features having an average dimension (e.g., average diameter) of from about 5 nanometers (nm) to about 5 micrometers (μm) which micrometers may be called microns, that may, by way of example, be measured in a direction parallel to a surface (e.g., sidewall) that at least partially defines a cavity to which a subject material in a vapor cell is exposed. For example, "pores" may include interconnected, three-dimensional networks of voids within a material that may be occupied by environmental fluids (e.g., air, inert gas). "Pores" may also include, for example, depressions, divots, dimples, and other surface features having average dimensions (e.g., average diameters) less than 500 microns, which may be measurable as surface roughness.

The term "micropore," as used herein, means and includes pores having an average dimension (e.g., average diameter) of from about 1 micron to less than about 5 microns, that may be measured in a direction parallel to a surface (e.g., sidewall) that at least partially defines the cavity to which the subject material in the vapor cell is exposed. The term "nanopore," as used herein, means and includes pores having an average dimension (e.g., average diameter) of from about 5 nm to less than about 1,000 nm (i.e., less than about 1 micron), that may be measured in a direction parallel to a surface (e.g., sidewall) that at least partially defines the cavity to which the subject material in the vapor cell is exposed.

Unless the context indicates otherwise, removal of materials or surface modifications described herein may be accomplished by any suitable technique including, but not limited to, etching (e.g., dry etching, wet etching, vapor etching, deep reactive ion etching (DRIE)), ion milling, abrasive planarization (e.g., chemical-mechanical planarization (CMP)), or other known methods.

The upper operating temperature of atomic sensors and atomic clocks, such as chip scale atomic clocks (CSACs), without limitation, may be limited by excessive optical absorption and collisional line broadening due to the high density of subject material (e.g., alkali metal, strontium, ytterbium) vapor at elevated temperatures. The vapor pressure above a liquid may be suppressed by altering the shape of the outer surface of the liquid, such as, for example, by containing the liquid within a pore of a pore construction (e.g., a pore structure). Such a process may be applicable for depressing the vapor pressure of the subject material (e.g., alkali metal, strontium, ytterbium). In accordance with the Kelvin equation, a radius of a droplet is positive when the curvature of the droplet of a subject liquid is convex, such as is exhibited when the vapor pressure is greater than the saturation pressure. When the curvature of the droplet is concave, the radius of the droplet is negative, such as is exhibited when the vapor pressure is less than the saturation pressure. When the vapor pressure is less than the saturation pressure, the vapor cell may be operable, providing more consistent and reliable behavior of the subject material, across a greater range of temperatures (e.g., from about-45 degrees Celsius (° C.) to about 250° C.), such as, for example, at high temperatures (e.g., 90° C. or higher).

Reducing the vapor pressure of a subject material within vapor cells (e.g., atomic clocks, atomic sensors) may be achieved by introducing at least one pore that, combined with the surface tension of the subject material in the at least one pore, alters the shape of the subject material in the at least one pore. Stated another way, the interaction between the subject material and the size and shape of a pore causes a shape of a surface of the subject material to change in a desired manner (e.g., introduces a disturbance) as compared to a shape of a surface of the subject material when on an at least a substantially flat nonporous surface.

Figure 1B:
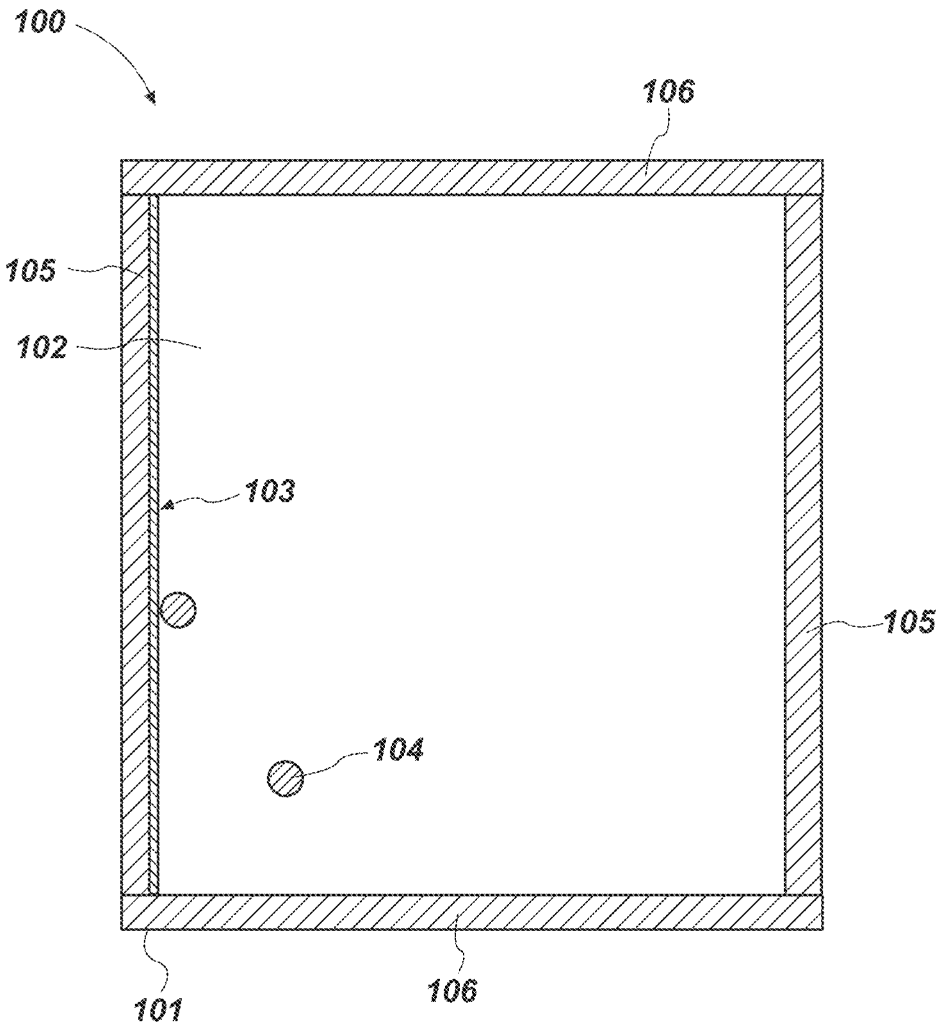

FIGS. 1A and 1B are schematic cross-sectional side view examples of vapor cells 100. The vapor cells 100 may include, for example, a body 101 which includes a cavity 102 therein. The cavity 102 may be sized and shaped to contain a subject material 104 (e.g., an alkali metal, strontium, ytterbium) therein. For example, the body 101 may include transparent or translucent windows 106 forming one or more walls (e.g., boundaries) of the body 101 at least partially defining the cavity 102, with the remaining sidewalls 105 being opaque and further defining the cavity 102. Thus, the transparent or translucent windows 106 forming one or more walls and the remaining sidewalls 105 may define the cavity 102 thereinbetween. More specifically, the windows 106 may include, for example, a transparent or translucent borosilicate glass material enabling a beam of radiation to pass through the windows 106 and into the cavity 102 of the vapor cell 100. The sidewalls 105 of the vapor cell 100 may include an opaque material (e.g., a silicon material), such as, for example, when the vapor cell 100 is integrated into, by way of example, an atomic sensor, a chip-scale atomic clock or a chip-scale atomic magnetometer.

A transparency of the material of the windows 106 may be, for example, about 10% or more within wavelengths of radiation to be directed toward the cavity. More specifically, the transparency of the material of the windows 106 may be, for example, from about 10% to about 99% within wavelengths of radiation to be directed toward the cavity. As a specific, nonlimiting example, the transparency of the material of the windows 106 may be, for example, from about 20% to about 95% (e.g., about 25%, about 50%, about 75%).

A vapor cell 100 in accordance with examples of the disclosure includes one or more pores 103. The one or more pores 103 may be disposed on an internal portion of one or more of the sidewalls 105 of the vapor cell 100 such that the one or more pores 103 are exposed to the subject material 104 contained in the cavity 102, as shown in FIG. 1A. The internal portion or portions of the respective sidewall 105 at least partially defining the cavity 102 may include one or more pores 103 exposed to the subject material 104 contained in the cavity 102. For example, a material of the relevant portion or portions of a respective sidewall 105 itself may be porous, and at least some of the pores 103 of the portion of the respective sidewall 105 may be exposed to the subject material 104 contained in the cavity 102. More specifically, the portion of the respective sidewall 105 may be subjected to a process different from processing a remainder of the sidewall 105 to introduce porosity into the portion of the respective sidewall 105, such as, for example, by forming an array of micropores, an array of nanopores, or an array of micropores and nanopores. As a specific, nonlimiting example, the portion or portions of the respective sidewall 105 may be surface roughened or otherwise subjected to a material removal process (e.g., sand blasted, etched, ground) to form one or more pores 103 in the portion or portions of the respective sidewall 105, which process is not performed on the remainder of the respective sidewall 105, such that the remainder of the respective sidewall 105 is at least substantially free of pores 103. Selective formation of pores in a given portion of a respective sidewall 105 may be accomplished by, for example, an aluminum hard mask employed to form the at least one pore in the respective sidewall 105 with the desired size, shape, and configuration. In one non-limiting example the surface roughness of the portion of the respective sidewall 105 exhibiting one or more pores 103 may be from about 5 nm to about 1 micron.

In other examples, such as that shown in FIG. 1B, at least substantially an entirety of at least one of the sidewalls 105 at least partially defining the cavity 102 may include one or more pores 103 exposed to the subject material 104 contained in the cavity 102. For example, a material of a respective sidewall 105 itself may be porous, and at least some of the pores 103 of the respective sidewall 105 may be exposed to the subject material 104 contained in the cavity 102. Alternatively, an entirety of at least one respective sidewall 105 may be subjected to a process different from processing one or more other sidewalls 105 to introduce porosity into the respective sidewall 105. As a specific, nonlimiting example, the entirety of the at least one respective sidewall 105 at least partially defining the cavity 102 may be surface roughened or otherwise subjected to a material removal process (e.g., sand blasted, etched, ground) to form one or more pores 103 in the respective sidewall 105, which processing may not be performed on others of the sidewalls 105, such that others of the sidewalls 105 may be at least substantially free of pores.

In some examples, more than one of the sidewalls 105 at least partially defining the cavity 102 may include pores 103 to tailor the vapor pressure of the subject material 104 to a target performance. The pores 103 may be positioned so as not to interfere with a light path between a source and a detector in a device, such as a chip scale atomic clock (CSAC). For example, the pores 103 may be positioned on opaque sidewalls 105 at least partially defining the cavity 102, while pores 103 may be omitted from transparent windows 106 further defining the cavity 102.

The vapor cell 100 may be sized and shaped to enable a beam of radiation to pass through the body 101 and into the cavity 102. For example, the windows 106 of the body 101 may enable radiation of one or more wavelengths or wavelength spectra to pass through the windows 106 and into the cavity 102 when the vapor cell 100 is in operation. More specifically, the windows 106 may include a material (e.g., borosilicate glass) translucent or transparent to radiation (e.g., in the visible spectrum, infrared radiation, ultraviolet radiation, microwave radiation) directed toward the subject material 104 within the cavity 102.

The cavity 102 may be sized and shaped to contain the subject material 104, at least a portion of which may be in a vapor state and may be impacted by incident radiation arriving through the windows 106 when the vapor cell 100 is in operation. A cross-sectional shape of the vapor cell 100 may be any suitable shape, such as, for example, square, oval, circular, rectangular, polygonal, or irregular. The cavity 102 of the vapor cell 100 may have a volume of, for example, about $1\times10^4$ cubic millimeters ($mm^3$) or less. More specifically, as a nonlimiting example, the volume of the cavity 102 of the vapor cell 100 may be from about 0.1 $mm^3$ to about $1\times10^4$ $mm^3$ (e.g., about 10 $mm^3$, about 100 $mm^3$, about $1\times10^3$ $mm^3$, about $1\times10^4$ $mm^3$). The cavity 102 may be, for example, hermetically sealed.

In the examples illustrated in FIGS. 1A and 1B, the cavity 102 of the vapor cell 100 may be enclosed by the sidewalls 105 and the windows 106. As illustrated in FIGS. 1A and 1B, the windows 106 may be positioned on opposing sides at least partially defining the cavity 102, with the sidewalls 105 oriented perpendicular to, and extending between, the windows 106. In other examples, the vapor cell 100 may include more or fewer windows 106 (e.g., one window, all walls formed as windows); sidewalls 105 may be oriented at an oblique angle or may curve relative to the window or windows; one or more sidewalls 105 may be located in the same plane as one or more of the corresponding windows 106; or, any combination or subcombination of these features may be present.

As illustrated in FIGS. 1A and 1B, the pores 103 may be located directly in one or more of the walls at least partially defining the cavity 102, such as, for example, in the sidewalls 105. In some examples, the material of the sidewalls 105 may define the pores 103. As another example, the material of the sidewalls 105 may be modified when forming the pores 103, such that the material defining the pores 103 may be different from the material forming a remainder of the material of the sidewalls 105, the windows 106, or both. More specifically, a process for forming the pores 103 may alter the material composition of the sidewalls 105 defining the pores 103, or the material of the sidewalls 105 defining the pores 103 may be deliberately altered following formation of the pores 103. As a specific, nonlimiting example, the material of the sidewalls 105 defining the pores 103 may include silicon dioxide ($SiO_2$).

In some examples, the portion of the sidewall 105 including the pore 103 or pores 103 may be concentrated in a single discrete portion of the sidewall 105. In other examples, the sidewall 105 may include pores 103 in multiple different portions of the sidewall 105. A single discrete portion, multiple different portions, a total surface area occupied by all portions, shapes of portions, positions of portions, sizes and shapes of pores 103 in the portion or portions, or any combination or subcombination of these features may be selected to induce the vapor pressure of a subject material 104 in the cavity 102 to be within predetermined thresholds in anticipated operating conditions for the vapor cell 100.

As illustrated in FIG. 1B, one or more sidewalls 105 at least partially defining the cavity 102 may include pores 103 exposed to the subject material 104 contained in the cavity 102, and one or more other sidewalls 105 at least partially defining the cavity 102 may lack pores 103. For example, one, some, or all of the sidewalls 105 may be porous and/or have a surface roughness to form pores 103 proximate to the cavity 102, and one or some of the sidewalls 105 may be nonporous.

Figure 2A:
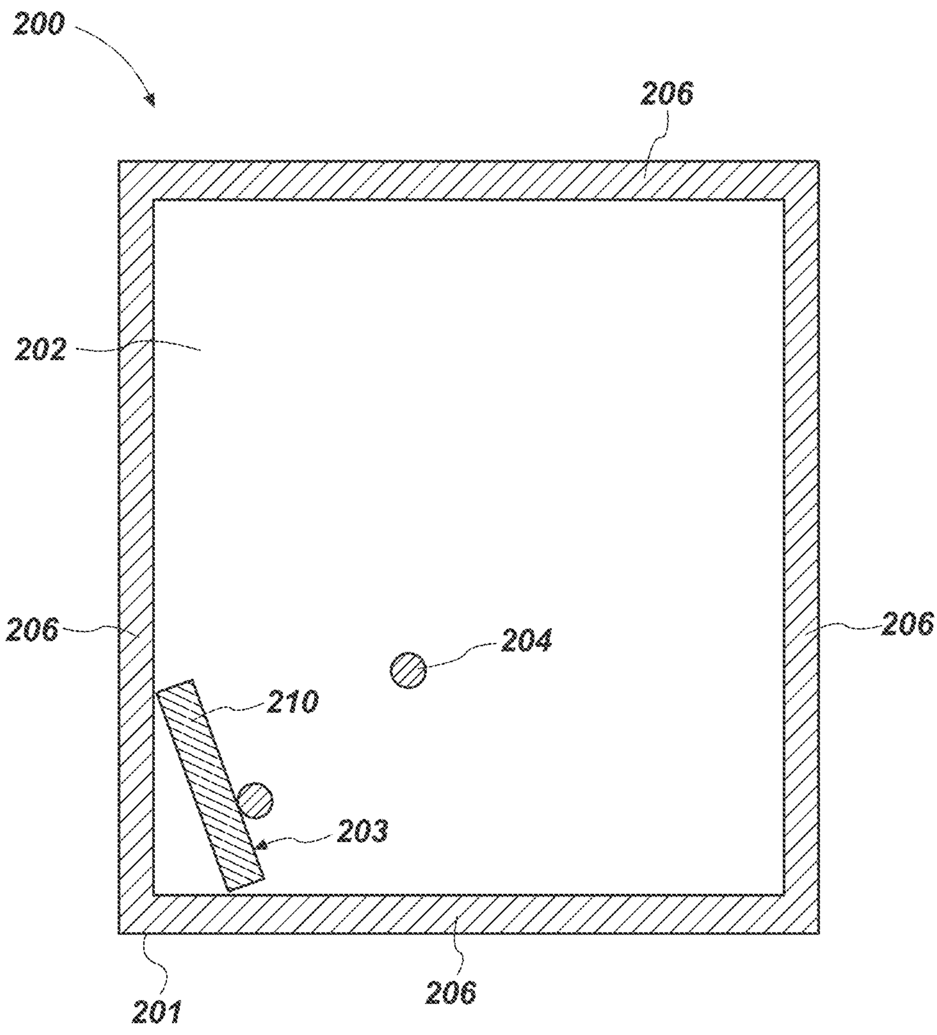
FIGS. 2A, 2B, and 2C are schematic cross-sectional side views of other examples of vapor cells.
Figure 2B:
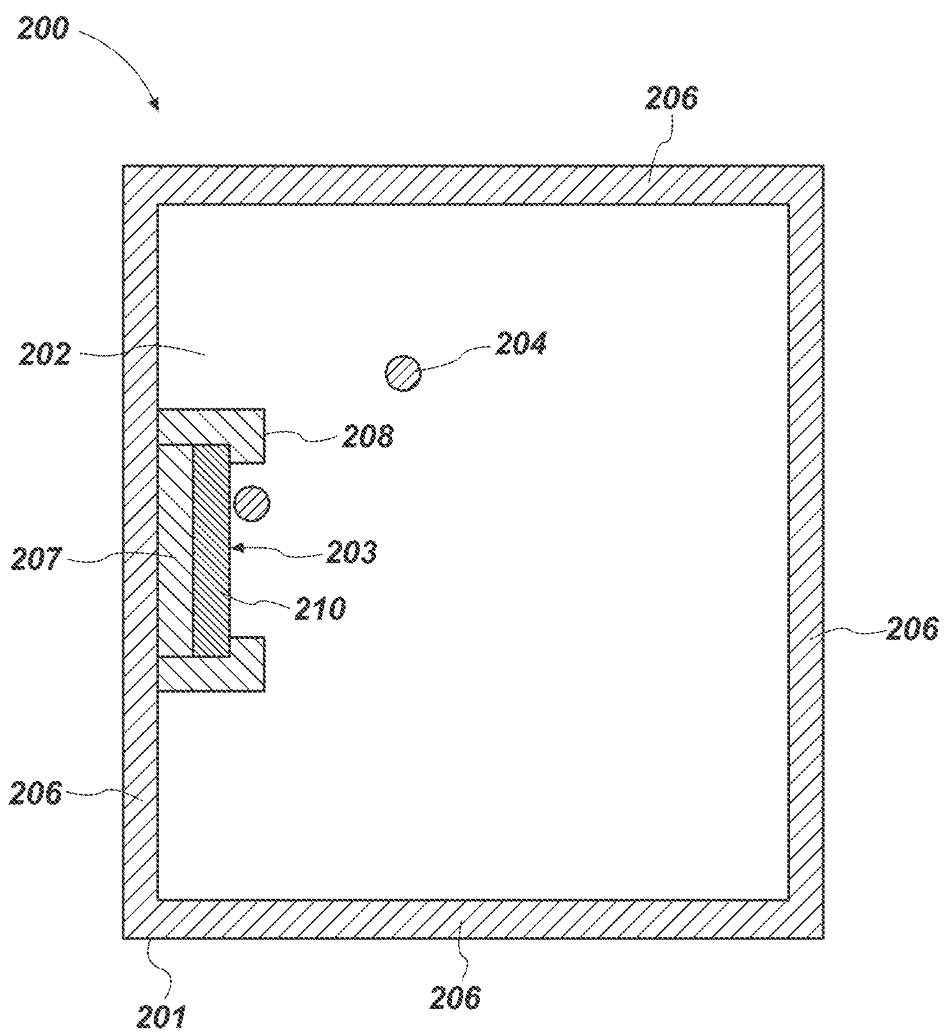
Figure 2C:
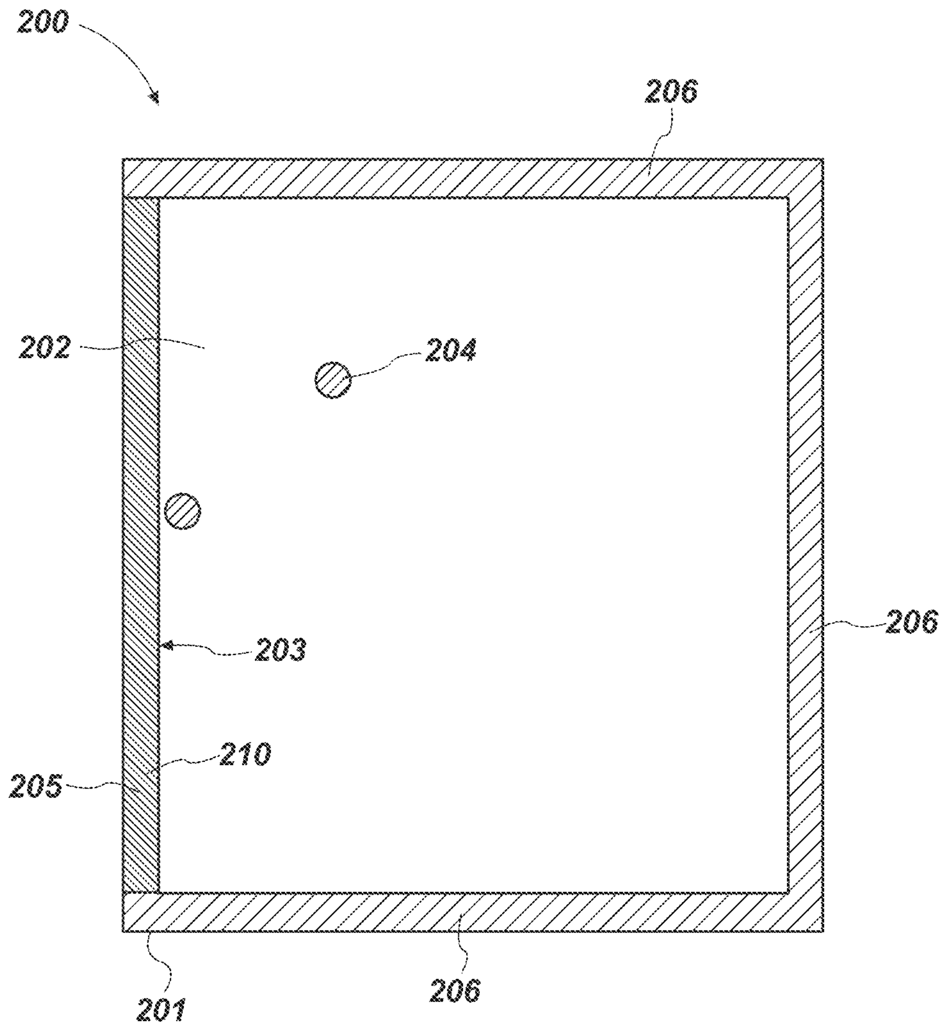

FIGS. 2A, 2B, and 2C are schematic cross-sectional side views of other examples of vapor cells 200. The vapor cells 200 may include a body 201 having a cavity 202 therein. A majority of walls defining the body 201 may be formed from windows 206, as shown in FIGS. 2A, 2B, and 2C. For example, an entirety of the body 201 may be formed of a material transparent to a predetermined wavelength of radiation, such that the body 201 is composed of windows 206, as shown in FIGS. 2A and 2B. More specifically, the body 201 may include, for example, a discrete, unitary transparent material comprising windows 206 enclosing the cavity 202. As a specific, nonlimiting example, the body 201 may include a borosilicate glass defining the cavity 202. As another example, a majority of all but one of the walls of the body 201 may be formed of the transparent material, such that the body 201 is largely composed of windows 206, as shown in FIG. 2C. More specifically, the body 201 may include, for example, a transparent material defining a first portion (e.g., windows 206), and forming a majority, of the cavity 202, and an opaque material defining a second, different portion (e.g., sidewall 205), and forming a minority, of the cavity 202. As a specific, nonlimiting example, the body 201 may include a borosilicate glass located around and securing a silicon material, the silicon material forming only one sidewall 205 at least partially defining the cavity 202, as shown in FIG. 2C.

At least one pore structure 210 including one or more pores 203 may be introduced inside the cavity 202. The pore structure 210 may include any material capable of defining one or more pores 203 and suitable for use in view of the anticipated operating conditions in the cavity 202 of the vapor cell 200. For example, the material of the pore structure 210 may be non-reactive with the subject material 204 (e.g., alkali metal, strontium, ytterbium), atmospheric material within the cavity 202, and the material of the body 201. More specifically, the pore structure 210 may include, for example, a silicon material. The pore structure 210 may include one or more pores 203 exposed to the subject material 204 in the interior of the cavity 202.

As illustrated in FIG. 2A, the pore structure 210 may be movable within the cavity 202. For example, the pore structure 210 may be confined within the cavity 202 by the body 201 and may be otherwise detached from, and unconstrained by, the body 201 and any other structures within the cavity. More specifically, the pore structure 210 may be, for example, free to move within the cavity 202, lacking any physical, chemical, or other attachment to the walls of the body 201 at least partially defining the cavity 202. As a specific, nonlimiting example, the pore structure 210 may be discrete from, and free to move relative to, the body 201, with the walls (e.g., windows 206) of the body 201 at least partially defining the cavity 202, the body 201 forming the only constraint on movement of the pore structure 210 within the cavity 202.

As illustrated in FIG. 2B, the pore structure 210 may be affixed to, and movable with, the body 201. For example, the pore structure 210 may be affixed to the body utilizing a bracket 208, an adhesive 207, or a combination or subcombination of the two and/or other techniques for affixing a pore structure 210 to a body 201 within a cavity 202 defined by a body 201.

As illustrated in FIG. 2C, the pore structure 210 may be integrally formed in a sidewall 205 at least partially defining the cavity 202 and affixed to a remainder of the body 201. For example, the material of the remainder of the body 201 may be provided around the pore structure 210 integrally formed in the respective sidewall 205 in a deformable state, and the material of the remainder of the body 201 may be subsequently fixed in place around the pore structure 210 integrally formed in the respective sidewall 205 to affix the pore structure 210 to the remainder of the body 201. More specifically, the material of the window 206 or windows 206 may be positioned around the material of the pore structure 210 integrally formed in the respective sidewall 205 in a deformable state (e.g., when blowing the window 206 or windows 206 from a borosilicate glass material), and the pore structure 210 integrally formed in the respective sidewall 205 may be affixed to a portion of the window 206 or windows 206 surrounding a corresponding portion of the pore structure 210. As the window 206 or windows 206 cools, the pore structure 210 integrally formed in the respective sidewall 205 may form one wall (e.g., respective sidewall 205) at least partially defining the cavity 202 and the windows 206 may form the remainder of the walls defining the cavity 202 of the vapor cell 200. A geometry of the cavity 202 may constrain the position of the pore structure 210 in a specific location within the cavity 202. More specifically, borosilicate glass of the body 201 in a heated, viscous state may be placed around and in contact with the pore structure 210, and the body 201 may be cooled to a higher-viscosity or solid state to affix the pore structure 210 to the remainder of the body 201. As a specific, nonlimiting example, the body 201 and the pore structure 210 may be bound together by means of anodic bonding.

In some examples, a size, shape, number, and porosity of the pore structure 210 may be selected to tailor the vapor pressure of the subject material 204 to a targeted performance. For example, decreasing the size (e.g., average dimension, average diameter) of the pores 203 on the pore structure 210 may result in a corresponding increase in a maximum temperature at which the vapor pressure within the vapor cell 200 may be within specified target values. As another example, increasing the size (e.g., average dimension, average diameter) of the pores 203 may result in a corresponding decrease in a maximum temperature at which the vapor pressure within the vapor cell 200 may be within specified target values.

Figure 3:
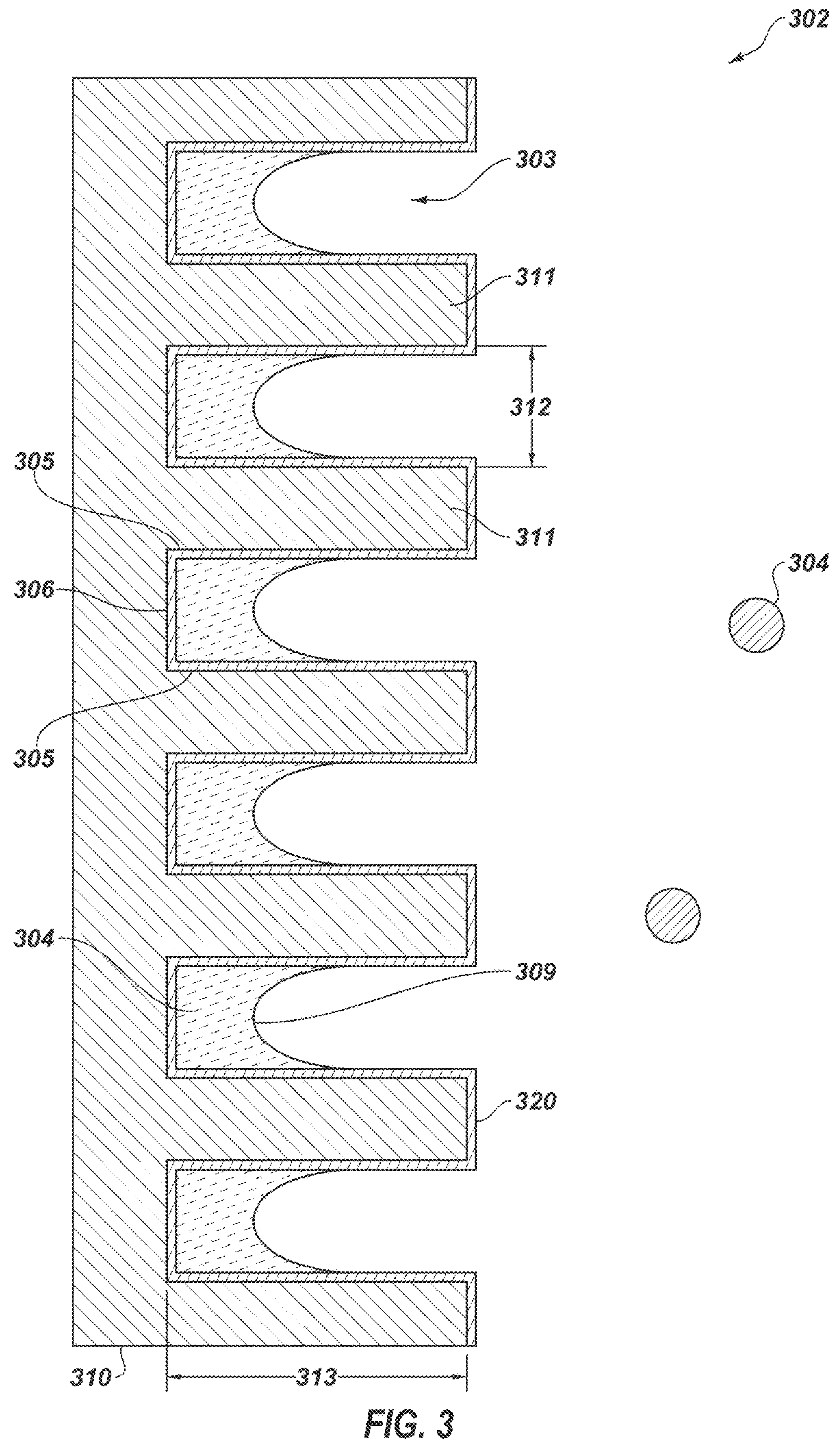
FIG. 3 is an enlarged, schematic cross-sectional side view of an example of a pore structure including one or more pores having uniform pore dimensions exposed to a cavity of a vapor cell.

FIG. 3 is an enlarged, schematic cross-sectional side view of a pore structure 310 defining one or more pores 303 exposed to a subject material 304 contained in a cavity 302 of a vapor cell. The pores 303 may exhibit a substantially uniform pore dimension 312 (e.g., substantially uniform pore diameter), for example, of from about 10 nm to about 10,000 nm. More specifically, the substantially uniform pore dimension 312 (e.g., substantially uniform pore diameter) of the pores 303 exposed to the subject material 304 (e.g., alkali metal, strontium, ytterbium) contained in a cavity 302 of a vapor cell may be, for example, from about 500 nm to about 5,000 nm (e.g., about 500 nm, about 1,000 nm, about 1,500 nm, about 2,500 nm), such as may be measured in a direction parallel to a wall (e.g., sidewall 105 (FIGS. 1A and 1B)) at least partially defining the cavity 302 to which the pores 303 are exposed. As a specific, nonlimiting example, the substantially uniform pore dimension 312 (e.g., substantially uniform pore diameter) of the pores 303 exposed to the cavity 302 may be, for example, about 1,000 nm.

The pores 303 include internal surfaces, for example, pore sidewalls 305 and bottoms 306, as shown in FIG. 3. In some examples, the internal surfaces of the respective pores 303 (i.e., pore sidewalls 305 and bottoms 306) form pores 303 having a cylindrical configuration (e.g., a substantially cylindrical configuration).

The pore structure 310 includes a substrate material 311 which forms pore sidewalls 305 of the pores 303, as shown in FIG. 3. In some examples, the substrate material 311 may comprise silicon (e.g., silicon wafer), and the pores 303 may be formed in the substrate material 311 having substantially uniform pore dimensions 312 (e.g., substantially uniform pore diameters) of about 1,000 nm by way of a suitable removal process (e.g., deep reactive ion etching (DRIE), without limitation). The pores 303 formed in the substrate material 311 may exhibit a depth 313, as also shown in FIG. 3. The depth 313 of the pores 303 may be from about 100 nm to about 100.000 nm.

The pores 303 exhibit substantially uniform pore dimensions 312 (e.g., substantially uniform pore diameters) and are shaped to cause a meniscus 309 of the subject material 304 in a fluid state within the pores 303 to also have a uniform shape which is different than a shape an exposed surface of the subject material 304 in a liquid state would have on a flat, nonporous surface under the same operating conditions (e.g., temperature, pressure). For example, a radius of the meniscus 309 of the subject material 304 in the fluid state within the pores 303 having substantially uniform pore dimensions 312 (e.g., substantially uniform pore diameters) may be negative (i.e., the meniscus 309 may be concave). More specifically, the size and shape of the uniform pores 303 may induce the meniscus 309 of the subject material 304 in the fluid state to exhibit a uniform concave shape through capillary action (e.g., the pores 303 may include capillaries), such that the height of the subject material 304 in the center of the pores 303 is less than the height of the subject material 304 near the pore sidewalls 305 of the pores 303 having substantially uniform pore dimensions 312 (e.g., substantially uniform pore diameters), as illustrated, by way of example, in FIG. 3.

Altering the shape of the meniscus 309 of the subject material 304 in the fluid state within the pores 303 alters the vapor pressure of the subject material 304 within the cavity 302. For example, inducing the meniscus 309 of the subject material 304 in the liquid state within the cavity 302 to have a negative radius (e.g., a concave meniscus 309) may cause the vapor pressure of the subject material 304 within the cavity 302 to be less than a saturation pressure of the subject material 304 in a vapor state within the cavity 302. More specifically, the size and shape of the pores 303 having substantially uniform pore dimensions 312 (e.g., substantially uniform pore diameters), and the corresponding size and shape of the meniscus 309 (e.g., concave meniscus 309) of the subject material 304 within the pores 303, may cause a greater proportion of the subject material 304 within the cavity 302 to be in the liquid state than a proportion of the subject material 304 that would be in the liquid state absent the pores 303.

A pore structure 310 may have a liner material 320 disposed over at least a portion of respective ones of the pores 303 of the pore structure 310. Quantities of the liner material 320 may be disposed at least over the extent of the pore sidewalls 305 of respective pores 303 of the pore structure 310. Optional quantities of liner material 320 may be disposed over other portions of respective pores 303 as long as the coverage is substantially uniform at least over the extent of the pore sidewalls 305 among respective pores 303 having substantially uniform pore dimensions 312 (e.g., substantially uniform pore diameters) of the pore structure 310. In some examples, a pore structure 310 may include a liner material 320 disposed over the pores 303 of the pore structure 310, wherein the liner material 320 may exhibit a uniform thickness over the pore sidewalls 305 and bottoms 306 of the pores 303, as shown in FIG. 3. A liner material 320 may have a uniform thickness in a range of from about 10 nm to about 1,000 nm. In some examples, the liner material exhibits a substantially uniform thickness over at least the pore sidewalls 305 of the pores 303 of the pore structure 310 to assure that the pores 303 of the pore structure 310 exhibit substantially uniform pore dimensions 312 (e.g., substantially uniform pore diameters).

The liner material 320 may be selected of a material on which the subject material 304 exhibits a lower wetting angle (e.g., about 50% lower, about 60% lower, about 75% lower) than the subject material 304 exhibits on the underlying substrate material 311 under the same operating conditions (e.g., temperature, pressure). In some examples, the underlying substrate material 311 comprises silicon and the subject material 304 comprises an alkali metal (e.g., cesium) which exhibits a wetting angle of about 70 degrees on the silicon substrate material 311. In other examples, the liner material 320 comprises a metal or metal alloy (e.g., a noble metal, platinum) on which the subject material 304 (e.g., cesium) exhibits a reduced wetting angle of about 30 degrees.

The reduction in the wetting angle of the subject material 304 on the liner material 320 allows for an increase in the substantially uniform pore dimensions 312 (e.g., substantially uniform pore diameters) while maintaining the target vapor pressure suppression (e.g., equivalent to about 25° C.). The suppression of the vapor pressure of the subject material 304 may cause a reduction in the accumulation of the subject material 304 on the windows of the vapor cell itself. The increase in viable substantially uniform pore dimensions 312 (e.g., substantially uniform pore diameters) allows for reliable and repeatable automated fabrication (e.g., DRIE) of a pore structure 310 having pores 303 with substantially uniform pore dimensions 312 (e.g., substantially uniform pore diameters of about 1,000 nm).

FIG. 4 is a flowchart depicting an example of an illustrative method 400 of using a vapor cell. The method 400 may involve, for example, providing a vapor cell including a body defining a cavity within the body, as shown at act 402. At least a portion of at least one surface within the cavity including one or more pores having a substantially uniform diameter of from about 500 nm to about 5,000 nm. In accordance with some examples, at least a portion of at least one surface within the cavity includes one or more pores having a substantially uniform diameter of about 1,000 nm, as also shown at act 402. More specifically, one of the vapor cells 100, 200 depicted in FIGS. 1A, 1B, 2A, 2B, and 2C may be provided. In some examples, the at least one surface within the cavity including the pores may be a wall (e.g., sidewall) of a body of the vapor cell at least partially defining the cavity. In other examples, the at least one surface within the cavity including the pores may be a pore structure discrete from the body and located within the cavity.

The vapor pressure of the subject material within the cavity may be controlled, as indicated at act 404. Control over the vapor pressure may be achieved by, for example, providing an amount of the subject material within the cavity of the body with the one or more pores, ensuring that the amount of the subject material within the cavity is insufficient to fully saturate (e.g., to fully occupy) the one or more pores under anticipated operating conditions. A pressure and a temperature within the cavity may be controlled (e.g., by inducing a selected pressure within the cavity, by transferring heat to or from the cavity, by exposing the vapor cell to conditions in the operating environment) to induce a portion of the subject material to be in a vapor state within the cavity and another portion of the subject material to be in a liquid state within the one or more pores. In some examples, an exposed surface of the subject material in a liquid state within the one or more pores may be induced to have a shape different than a shape of the exposed surface of the subject material in a liquid state would have on a flat, nonporous surface, as also indicated at act 404. More specifically, a meniscus of the subject material in the liquid state may be induced to be concave in some examples, as further indicated at act 406, to render a vapor pressure of the subject material lower than a saturation pressure of the subject material in the cavity. As a specific, nonlimiting example, the uniform size, shape, and position of the one or more pores within the cavity may induce the subject material in the liquid state within the pores to have a concave shape through capillary action.

In some examples, radiation may be directed toward the subject material within the vapor cell utilizing a radiation source oriented toward the vapor cell, as indicated at act 408.

In some examples, control of the vapor pressure while operating the vapor cell may enable reliable operation of an atomic sensor, an atomic clock, a magnetometer or a gyroscope incorporating the vapor cell at operational temperatures ranging from about −45° C. to about 250° C., as indicated at act 410. More specifically, vapor cells in accordance with this disclosure may enable reliable operation of an atomic sensor, an atomic clock, a magnetometer or a gyroscope incorporating the vapor cell at operational temperatures ranging from about −45° C. to about 250° C.

When operating a vapor cell in accordance with this disclosure, the cavity of the vapor cell may be placed in the path of radiation emittable by a radiation source (i.e., such that a subject material within the cavity may be impacted (e.g., excited) by incident radiation). The inclusion of one or more pores may enable the vapor pressure of the subject material to be controlled relative to the saturation pressure of the subject material. A meniscus of the subject material in a liquid state within the one or more pores may be induced to have a different shape from a shape the subject material would have in the liquid state on a flat, non-porous surface, which may affect the vapor pressure of the subject material.

Figure 5:
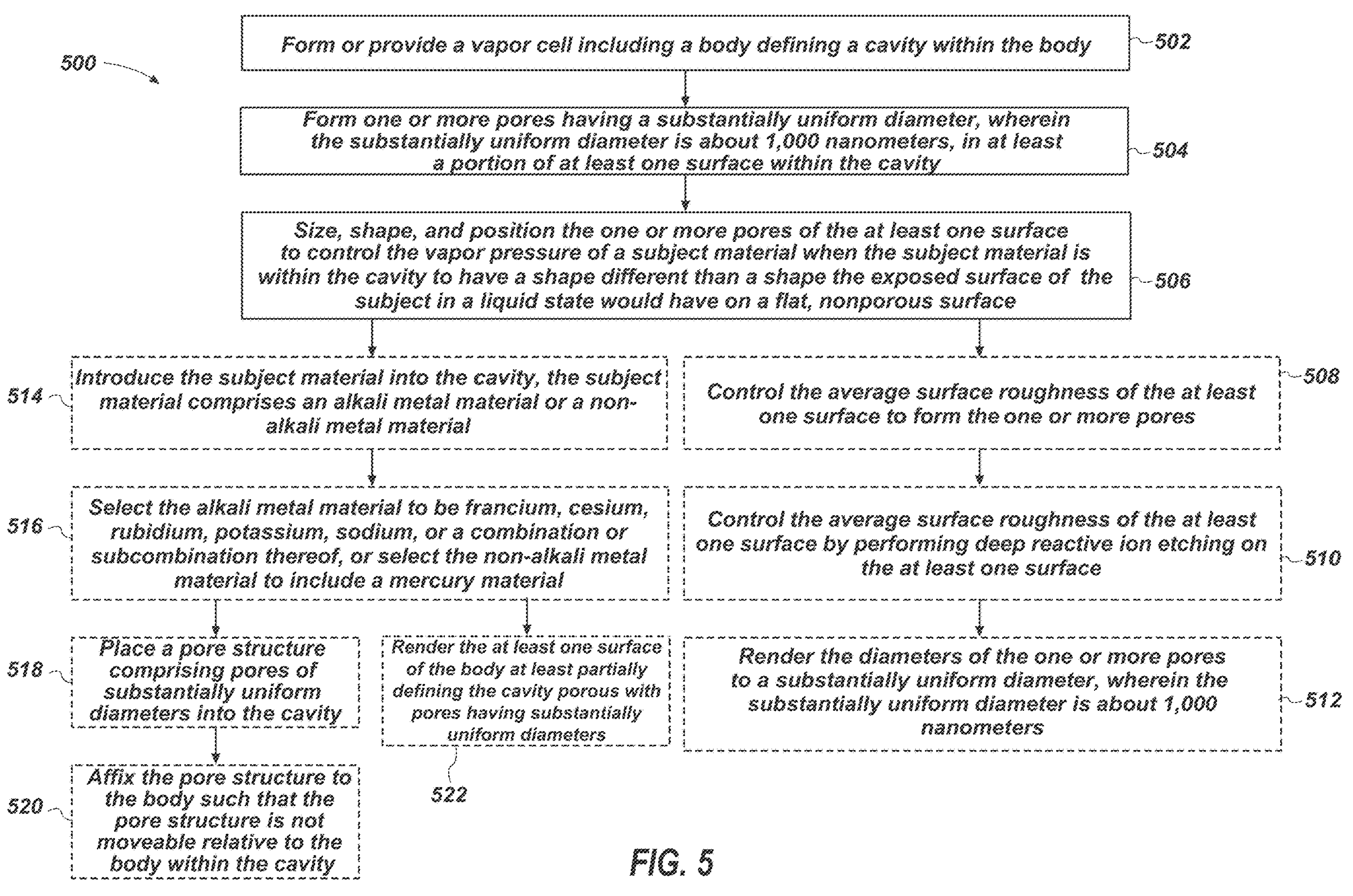
FIG. 5 is a flowchart depicting an example of an illustrative method of making a vapor cell.

FIG. 5 is a flowchart depicting an example of an illustrative method 500 of making a vapor cell. The method 500 may involve, for example, forming or providing a vapor cell including a body defining a cavity within the body, as indicated at act 502. The body of the vapor cell may contain a subject material within the cavity. As specific, nonlimiting examples, the body of the vapor cell may take any of the forms and may include any of the materials described previously in connection with FIGS. 1A, 1B, 2A, 2B, and 2C.

One or more pores having a substantially uniform diameter may be formed in at least a portion of at least one surface within the cavity, as indicated at act 504. The pores are formed having a substantially uniform diameter, for example, a uniform diameter as measured in a direction parallel to the at least one surface, wherein the substantially uniform diameter may be from about 500 nm to about 5,000 nm. In accordance with some examples, the pores are formed having a substantially uniform diameter, for example, a uniform diameter of about 1,000 nm, as also indicated at act 504. The one or more pores of the at least one surface may be substantially uniformly sized, shaped, and positioned to control the vapor pressure of a subject material when the subject material is within the cavity to have a shape different than a shape the exposed surface of the subject material in a liquid state would have on a flat, nonporous surface, as indicated at act 506.

In some examples, the one or more pores may be formed by controlling an average surface roughness of the at least one surface, as indicated at act 508. For example, the pores in the at least one surface may be formed by etching the surface. More specifically, deep reactive ion etching (DRIE) may be performed on the at least one surface to control the average surface roughness of the at least one surface, as indicated at act 510. A substantially uniform diameter of the pores, for example, as may be measured in a direction parallel to the at least one surface, may be from about 500 nm to about 5,000 nm. In some examples the method 500 includes rendering the diameters of the one or more pores to a substantially uniform diameter of about 1,000 nm, as indicated at act 512. The substantially uniform diameter of the pores may be selected to enable a meniscus of the subject material in a liquid state within the pores to maintain a shape different than a shape the exposed surface of the subject material in a liquid state would have on a flat nonporous surface under the same operating conditions (e.g., temperature, pressure).

In some examples, the method 500 includes introducing the subject material into the cavity, as indicated at act 514. The subject material may be selected to include an alkali metal material, as also indicated at act 514. In some examples, the subject material may be selected to include francium, cesium, rubidium, potassium, sodium, or a combination or subcombination thereof, as indicated at act 516. In other examples, the subject material may be selected to include a non-alkali metal material, as also indicated at act 514. For example, the subject material may include a mercury material (e.g., for use in a mercury ion clock), as also indicated at act 516. In some examples, the subject material may be selected to include a mixture of alkali metal materials.

In some examples, one or more surfaces (e.g., walls, sidewalls) of the body of the vapor cell defining or partially defining the cavity may be rendered porous, as indicated at act 522. For example, a material forming at least a portion of the body of the vapor cell itself, and positioned proximate to the cavity, may define the pores having substantially uniform diameters. More specifically, the material of at least a portion of the body exposed to the cavity may be modified in surface roughness and/or porosity to form pores having substantially uniform diameters.

In other examples, at least one pore structure having one or more pores of substantially uniform diameters may be placed within the cavity, as indicated at act 518. For example, the pore structure may be affixed to the body, such that the pore structure is not movable relative to the body, within the cavity, as indicated at act 520. More specifically, the pore structure may be affixed to the body utilizing, for example, a bracket, an adhesive, or a bracket and an adhesive.

FIG. 6 is a flowchart depicting another example of an illustrative method 600 of making a vapor cell. The method 600 may involve, for example, forming or providing a body of the vapor cell having walls defining a cavity thereinbetween, the cavity having an amount of a subject material contained therein, as indicated at act 602. As specific, nonlimiting examples, the body of the vapor cell may take any of the forms and may include any of the materials described previously in connection with FIGS. 1A, 1B, 2A, 2B, and 2C.

The method 600, in some examples, also includes forming a pore structure comprising a substrate material formed of silicon having pores of a substantially uniform dimension of about 1,000 nanometers formed therein, the pore structure disposed along a portion of one or more of the walls of the vapor cell, as indicated at act 604.

With continued reference to FIG. 6, the method 600 of making a vapor cell further includes forming a liner material of platinum having a uniform thickness over one or more internal surfaces of the pores, wherein the subject material exhibits a reduced wetting angle on the liner material which is less than a wetting angle of the subject material on the substrate material, as indicated at act 606.

Figure 7A:
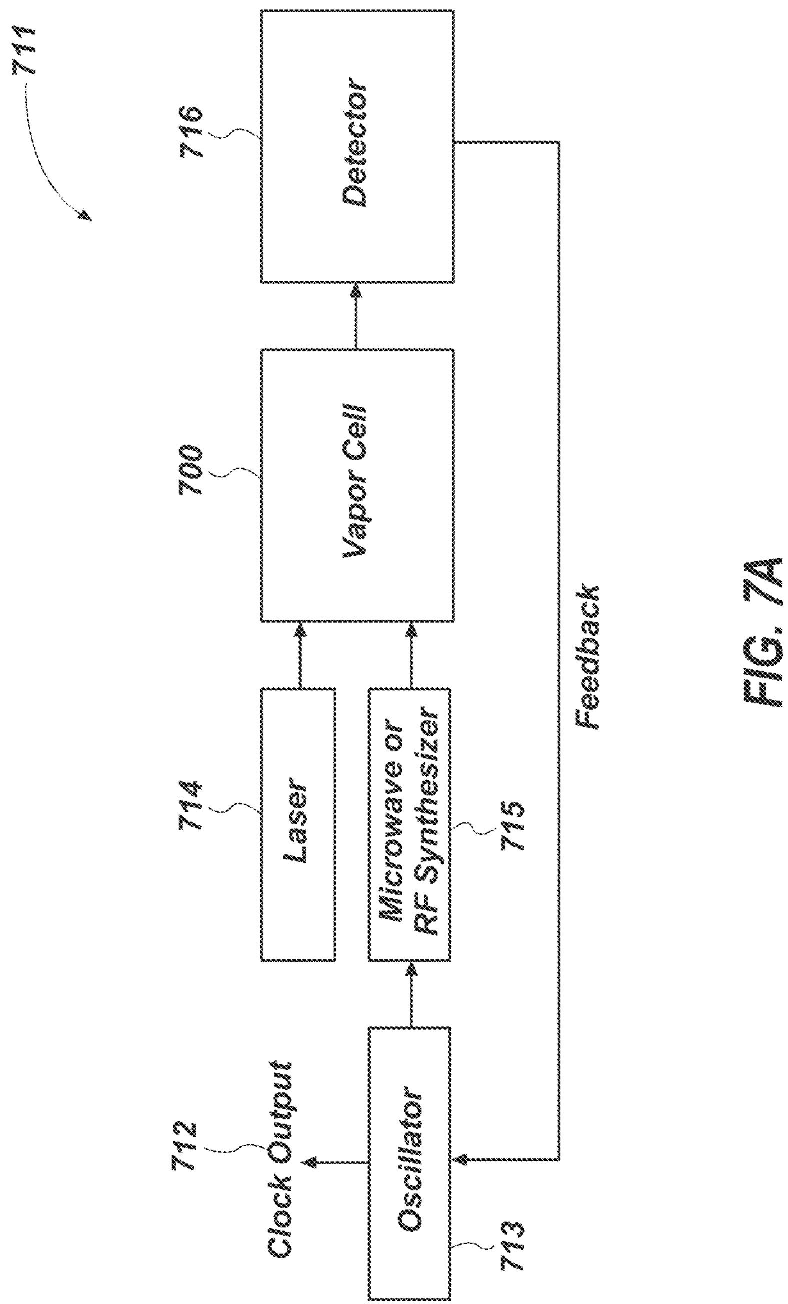
FIGS. 7A and 7B are schematics of illustrative systems including a vapor cell, in accordance with this disclosure.
Figure 7B:
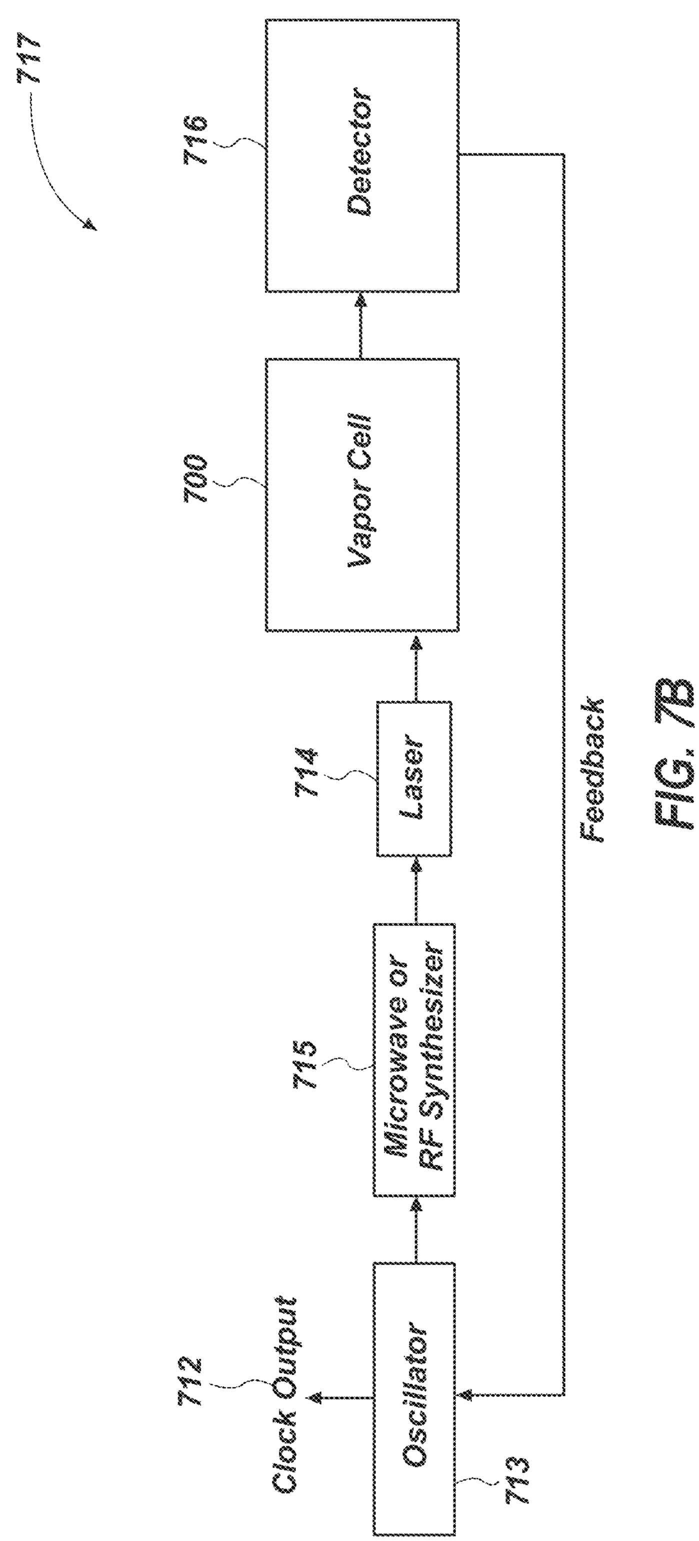

FIGS. 7A and 7B are schematics of illustrative systems 711 and 717, respectively, including a vapor cell 700 in accordance with this disclosure, differing in whether microwaves are applied directly to the vapor cell 700, as in a microwave-optical double-resonance clock or an Mx magnetometer shown in system 711, or applied as modulation to the laser bias current, as in a clock based on coherent population trapping or a Bell-Bloom type magnetometer shown in system 717. The systems 711 and 717 may be, for example, atomic sensors, atomic clocks, magnetometers, or gyroscopes.

The vapor cell 700 may include an examination region into which the vaporized atoms of the subject material may be directed, and one or more emitters (e.g., a first emitter 714 (e.g., a laser) or a second emitter 715 (e.g., a microwave, an RF synthesizer)), or both first emitter 714 and second emitter 715 may direct energy of a known type and intensity toward the examination region. A detector 716 may include a sensor to detect one or more properties of the vaporized atoms of the subject material in response to the emitted energy. For example, the sensor of the detector 716 may be oriented toward the examination region and detect the transition of the subject material between energy levels, responsive to the energy from the first emitter 714 (e.g., a laser), as measured in variation of signal strengths relative to the frequency of the microwaves emitted by the second emitter 715 (e.g., a microwave).

One or more signals representative of the properties measured by the detector 716 may be provided as feedback to an oscillator 713. The oscillator 713 may generate a clock output 712, which may be used as a clock signal itself or may be used to verify or synchronize another clock signal. In other words, the oscillator 713 may generate a clock output 712 timed to a frequency corresponding to the rate at which the atoms of the subject material transition between energy levels in response to changes in the frequency of radiation from the second emitter 715 (e.g., a microwave, an RF synthesizer) as detected by corresponding changes in the frequency of the energy from the first emitter 714 (e.g., a laser). The oscillator 713 may also be used to generate/synthesize radiation from the second emitter 715 (e.g., a microwave, an RF synthesizer).

Such a system 711 or 717 may be particularly useful for generating, verifying, or synchronizing clock signals of high accuracy and/or in extreme environmental conditions (e.g., near vacuum, low or micro gravity, near earth orbit and/or space). Systems 711 and 717 in accordance with this disclosure may find application in the aerospace industry (e.g., to control clock signals in satellites and spacecraft), the telecom and banking industries (e.g., to verify or set clock signals for relevant computing systems), and in standard-setting situations (e.g., to establish timings for relevant standards). By reducing the vapor pressure of the subject material in the vapor cell 700 of the system 711 or 717, the vapor cell 700 can operate over a wider range of ambient temperatures.

Additional non-limiting examples of the disclosure include:

Example 1: A vapor cell, comprising: a body having walls defining a cavity thereinbetween, the cavity containing an amount of a subject material; a pore structure comprising a substrate material having pores of a substantially uniform diameter formed therein, the pore structure disposed along a portion of one or more of the walls; and a liner material disposed over one or more internal surfaces of the pores.

Example 2: The vapor cell according to Example 1, wherein the body includes at least one window disposed on a different one of the one or more walls.

Example 3: The vapor cell according to any of Examples 1 and 2, wherein the pore structure is disposed along the portion of the one of the one or more walls a distance apart from the at least one window.

Example 4: The vapor cell according to any of Examples 1 through 3, wherein the pore structure is integrally formed in the portion of the one of the one or more walls.

Example 5: The vapor cell according to any of Examples 1 through 4, wherein the substrate material comprises silicon.

Example 6: The vapor cell according to any of Examples 1 through 5, wherein the pores are formed in the substrate material by deep reactive ion etching.

Example 7: The vapor cell according to any of Examples 1 through 6, wherein the substantially uniform diameter of the pores is from about 500 nanometers to about 5,000 nanometers.

Example 8: The vapor cell according to any of Examples 1 through 7, wherein the substantially uniform diameter of the pores is about 1,000 nanometers.

Example 9: The vapor cell according to any of Examples 1 through 8, wherein the pores comprise a cylindrical configuration.

Example 10: The vapor cell according to any of Examples 1 through 9, wherein the internal surfaces of the pores include a bottom and pore sidewalls.

Example 11: The vapor cell according to any of Examples 1 through 10, wherein the liner material is disposed over at least the pore sidewalls of the pores.

Example 12: The vapor cell according to any of Examples 1 through 11, wherein the liner material comprises a uniform thickness over at least the pore sidewalls of the pores.

Example 13: The vapor cell according to any of Examples 1 through 12, wherein the liner material comprises a metal or a metal alloy.

Example 14: The vapor cell according to any of Examples 1 through 13, wherein the liner material comprises platinum.

Example 15: The vapor cell according to any of Examples 1 through 14, wherein the subject material comprises an alkali metal.

Example 16: The vapor cell according to any of Examples 1 through 15, wherein the subject material exhibits a wetting angle on the liner material which is less than a wetting angle of the subject material on the substrate material.

Example 17: The vapor cell according to any of Examples 1 through 16, wherein portions of the subject material disposed within the pores exhibit a meniscus having a uniform shape.

Example 18: The vapor cell according to any of Examples 1 through 17, wherein the portions of the subject material disposed within the pores exhibit a concave meniscus.

Example 19: The vapor cell according to any of Examples 1 through 18, wherein the concave meniscus of the portions of the subject material disposed within the pores causes a vapor pressure of the subject material to be less than a saturation pressure of the subject material in a vapor state within the cavity of the vapor cell.

Example 20: The vapor cell according to any of Examples 1 through 19, wherein portions of the subject material disposed within the pores exhibit a concave meniscus.

Example 21: A method of manufacturing a vapor cell, comprising: forming a body of the vapor cell having walls defining a cavity thereinbetween, the cavity having an amount of a subject material contained therein; forming a pore structure comprising a substrate material formed of silicon having pores of a substantially uniform dimension of about 1,000 nanometers formed therein, the pore structure disposed along a portion of one or more of the walls of the vapor cell; and forming a liner material of platinum having a uniform thickness over one or more internal surfaces of the pores, wherein the subject material exhibits a reduced wetting angle on the liner material which is less than a wetting angle of the subject material on the substrate material.

Example 22: The method according to Example 21, wherein forming the body of the vapor cell comprises forming the body of the vapor cell having at least one window disposed on a different one of the one or more walls.

Example 23: The method according to any of Examples 21 and 22, wherein forming the pore structure comprises forming the pore structure having the pores of the substantially uniform dimension formed in the substrate material by deep reactive ion etching.

Example 24: The method according to any of Examples 21 through 23, wherein forming the liner material of the uniform thickness over the one or more internal surfaces of the pores comprises forming the liner material over at least pore sidewalls of the pores.

Example 25: The method according to any of Examples 21 through 24, wherein forming the liner material of the uniform thickness over the one or more internal surfaces of the pores comprises forming the liner material by atomic layer deposition.

Example 26: A system, comprising: an emitter positioned and oriented to direct radiation through windows of a vapor cell, wherein the vapor cell comprises: a body having walls defining a cavity thereinbetween and an amount of a subject material disposed in the cavity; a pore structure comprising a substrate material having pores of a substantially uniform diameter formed therein, the pore structure disposed along a portion of one or more of the walls; a liner material of a uniform thickness disposed over internal surfaces of the pores, the subject material exhibiting a wetting angle on the liner material which is less than a wetting angle of the subject material on the substrate material; and a detector positioned and oriented to detect the radiation directed through the windows of the vapor cell.

While certain illustrative examples have been described in connection with the figures, the scope of this disclosure is not limited to those examples explicitly shown and described in this disclosure. Rather, many additions, deletions, and modifications to the examples described in this disclosure may be made to produce examples within the scope of this disclosure, such as those specifically claimed, including legal equivalents. In addition, features from one disclosed example may be combined with features of another disclosed example while still being within the scope of this disclosure.

What is claimed is:

1. A vapor cell, comprising:

a body having walls defining a cavity thereinbetween, the cavity containing an amount of a subject material;

a pore structure comprising a substrate material having pores of a substantially uniform diameter formed therein, the pore structure disposed along a portion of one or more of the walls; and a liner material disposed over one or more internal surfaces of the pores, wherein the subject material exhibits a wetting angle on the liner material which is less than a wetting angle of the subject material on the substrate material.

2. The vapor cell of claim 1, wherein the body includes at least one window disposed on a different one of the one or more walls.

3. The vapor cell of claim 2, wherein the pore structure is disposed along the portion of the one of the one or more walls a distance apart from the at least one window.

4. The vapor cell of claim 1, wherein the pore structure is integrally formed in the portion of the one of the one or more walls.

5. The vapor cell of claim 1, wherein the substrate material comprises silicon.

6. The vapor cell of claim 5, wherein the pores are formed in the substrate material by deep reactive ion etching.

7. The vapor cell of claim 1, wherein the substantially uniform diameter of the pores is from about 500 nanometers to about 5,000 nanometers.

8. The vapor cell of claim 1, wherein the substantially uniform diameter of the pores is about 1,000 nanometers.

9. The vapor cell of claim 1, wherein the pores comprise a cylindrical configuration.

10. The vapor cell of claim 1, wherein the internal surfaces of the pores include a bottom and pore sidewalls.

11. The vapor cell of claim 10, wherein the liner material is disposed over at least the pore sidewalls of the pores.

12. The vapor cell of claim 11, wherein the liner material comprises a uniform thickness over at least the pore sidewalls of the pores.

13. The vapor cell of claim 1, wherein the liner material comprises a metal or a metal alloy.

14. The vapor cell of claim 1, wherein the liner material comprises platinum.

15. The vapor cell of claim 1, wherein the subject material comprises an alkali metal.

16. The vapor cell of claim 1, wherein portions of the subject material disposed within the pores exhibit a meniscus having a uniform shape.

17. The vapor cell of claim 16, wherein the portions of the subject material disposed within the pores exhibit a concave meniscus.

18. The vapor cell of claim 17, wherein the concave meniscus of the portions of the subject material disposed within the pores causes a vapor pressure of the subject material to be less than a saturation pressure of the subject material in a vapor state within the cavity of the vapor cell.

19. The vapor cell of claim 1, wherein portions of the subject material disposed within the pores exhibit a concave meniscus.

20. A method of manufacturing a vapor cell, comprising:

forming a body of the vapor cell having walls defining a cavity thereinbetween, the cavity having an amount of a subject material contained therein;

forming a pore structure comprising a substrate material formed of silicon having pores of a substantially uniform dimension of about 1,000 nanometers formed therein, the pore structure disposed along a portion of one or more of the walls of the vapor cell; and forming a liner material of platinum having a uniform thickness over one or more internal surfaces of the pores, wherein the subject material exhibits a reduced wetting angle on the liner material which is less than a wetting angle of the subject material on the substrate material.

21. The method of claim 20, wherein forming the body of the vapor cell comprises forming the body of the vapor cell having at least one window disposed on a different one of the one or more walls.

22. The method of claim 20, wherein forming the pore structure comprises forming the pore structure having the pores of the substantially uniform dimension formed in the substrate material by deep reactive ion etching.

23. The method of claim 20, wherein forming the liner material of the uniform thickness over the one or more internal surfaces of the pores comprises forming the liner material over at least pore sidewalls of the pores.

24. The method of claim 20, wherein forming the liner material of the uniform thickness over the one or more internal surfaces of the pores comprises forming the liner material by atomic layer deposition.

25. A system, comprising:

an emitter positioned and oriented to direct radiation through windows of a vapor cell, wherein the vapor cell comprises:

a body having walls defining a cavity thereinbetween and an amount of a subject material disposed in the cavity;

a pore structure comprising a substrate material having pores of a substantially uniform diameter formed therein, the pore structure disposed along a portion of one or more of the walls;

a liner material of a uniform thickness disposed over internal surfaces of the pores, the subject material exhibiting a wetting angle on the liner material which is less than a wetting angle of the subject material on the substrate material; and a detector positioned and oriented to detect the radiation directed through the windows of the vapor cell.

* * * * *